US012676626B2

(12) United States Patent
Roh et al.

(10) Patent No.: US 12,676,626 B2
(45) Date of Patent: Jul. 7, 2026

(54) ANALOG-TO-DIGITAL CONVERTER SETTING COMMON MODE VOLTAGE

(71) Applicant: Samsung Electronics Co., Ltd.,
Suwon-si (KR)

(72) Inventors: Hyung Dong Roh, Suwon-si (KR);
Kyung Hoon Lee, Suwon-si (KR);
Woong Taek Lim, Suwon-si (KR);
Young Jae Cho, Suwon-si (KR);
Michael Choi, Suwon-si (KR)

(73) Assignee: Samsung Display Co., Ltd.,
Gyeonggi-do (KR)

( * ) Notice: Subject to any disclaimer, the term of this patent is extended or adjusted under 35 U.S.C. 154(b) by 134 days.

(21) Appl. No.: 18/627,940

(22) Filed: Apr. 5, 2024

(65) Prior Publication Data

US 2025/0096811 A1      Mar. 20, 2025

(30) Foreign Application Priority Data

Sep. 15, 2023    (KR) ........................ 10-2023-0123281

(51) Int. Cl.
*H03M 1/12* (2006.01)
(52) U.S. Cl.
CPC ................................... *H03M 1/121* (2013.01)
(58) Field of Classification Search
CPC ........ H03M 1/121; H03M 1/12; H03M 1/124; H03M 1/215
USPC ................................. 341/120, 155, 159, 126
See application file for complete search history.

(56) References Cited

U.S. PATENT DOCUMENTS

| | | | |
|---|---|---|---|
| 7,619,448 B2 | 11/2009 | Wu et al. | |
| 8,558,725 B2 | 10/2013 | Kidambi | |
| 8,890,739 B2 | 11/2014 | Lewis et al. | |
| 9,647,643 B2 | 5/2017 | Gorecki et al. | |
| 9,800,438 B1 | 10/2017 | Zhang et al. | |
| 2016/0380660 A1* | 12/2016 | Polley .................. | H04B 1/0028 |
| | | | 375/350 |
| 2024/0204789 A1* | 6/2024 | Zhou ................... | H03M 1/0607 |

FOREIGN PATENT DOCUMENTS

CN            114614819 A      6/2022

* cited by examiner

*Primary Examiner* — Peguy Jean Pierre
(74) *Attorney, Agent, or Firm* — Harness Dickey & Pierce. P.L.C.

(57)            ABSTRACT

An analog-to-digital converter is provided. An analog-to-digital converter comprises an interleaver receiving and processing an input signal that is an analog signal and a plurality of sub-ADCs, wherein the interleaver includes a reference circuit outputting a second voltage based on a first voltage, a high-pass filter receiving the second voltage and outputting a first signal obtained by changing a common mode voltage of the input signal to the second voltage, a sampling circuit generating a second signal obtained by sampling an alternate current component of the first signal, and a buffer outputting a third signal obtained by buffering the second signal by using a buffering circuit, and the sub-ADC converts the third signal into a digital signal by using the first voltage.

20 Claims, 9 Drawing Sheets

10

<u>1</u>

<u>10</u>

<u>100</u>

<u>120</u>

ANALOG-TO-DIGITAL CONVERTER SETTING COMMON MODE VOLTAGE

CROSS-REFERENCE TO RELATED APPLICATION

This application claims priority from Korean Patent Application No. 10-2023-0123281 filed on Sep. 15, 2023 in the Korean Intellectual Property Office and all the benefits accruing therefrom under 35 U.S.C. 119, the contents of which in its entirety are herein incorporated by reference.

BACKGROUND

Technical Field

The present disclosure relates to an analog-to-digital converter.

Description of the Related Art

An analog-to-digital converter (ADC) may be used in various applications. Applications that require high accuracy may include analog-to-digital converters with high resolution, while analog-to-digital converters used in high-speed communication, signal analyzers, etc. may have a high sampling rate. To realize a high sampling rate, time-interleaved analog-to-digital converters may include multiple analog-to-digital converters that receive inputs in common. The multiple analog-to-digital converters may sample the inputs at different times. A sub-ADC inside the time-interleaved analog-to-digital converter may be affected by a high-speed operation depending on an input common mode voltage. Accordingly, a fixed input common mode voltage may be required for the high-speed operation of the sub-ADC.

BRIEF SUMMARY

An object of the present disclosure is to provide an analog-to-digital converter having improved performance.

The objects of the present disclosure are not limited to those mentioned above and additional objects of the present disclosure, which are not mentioned herein, will be clearly understood by those skilled in the art from the following description of the present disclosure.

According to an aspect of the present disclosure, there is provided an analog-to-digital converter comprising, an interleaver configured to receive and process an analog input signal; and at least one sub-ADC, wherein the interleaver includes a reference circuit configured to output a second voltage based on a first voltage, a high-pass filter configured to receive the second voltage and to output a first signal obtained by changing a common mode voltage of the input signal to the second voltage, a sampling circuit configured to generate a second signal obtained by sampling an alternate current component of the first signal, and a buffer configured to output a third signal obtained by buffering the second signal by using a buffering circuit, and wherein the sub-ADC is configured to convert the third signal into a digital output signal using the first voltage.

According to another aspect of the present disclosure, there is provided an analog-to-digital converter comprising a reference circuit configured to receive a first voltage from outside of the ADC and to output a second voltage based on the first voltage; a high-pass filter configured to receive the second voltage and to output a first signal obtained by changing a common mode voltage of an analog input signal to the second voltage; a sampling circuit configured to generate a second signal obtained by sampling an alternating current component of the first signal; a buffer configured to output a third signal obtained by buffering the second signal by using a buffering circuit; and a plurality of sub-ADCs configured to convert the third signal into a digital output signal, wherein the reference circuit is configured to output the second voltage using a replica circuit that replicates the buffering circuit of the buffer.

According to another aspect of the present disclosure, there is provided an analog-to-digital converter comprising a reference circuit including a replica circuit, which includes a first transistor and a current source, and a first operational amplifier in which a first input terminal of the first operational amplifier is connected to the replica circuit and configured to provide a first voltage to a second input terminal of the first operational amplifier; a high-pass filter including a first capacitor and a first resistor, the high-pass filter configured such that one end of the first capacitor is configured to receive an input signal and one end of the first resistor is connected to an output terminal of the reference circuit; a sampling circuit including a first switch and a second capacitor, one end of the first switch connected to an output terminal of the high-pass filter and another end of the first switch being connected to the second capacitor; a buffer configured to receive an output of the sampling circuit and including the same circuit as the replica circuit; and a plurality of sub-ADCs configured to convert an output signal of the buffer into a digital signal.

DETAILED DESCRIPTION OF THE DISCLOSURE

Figure 1:
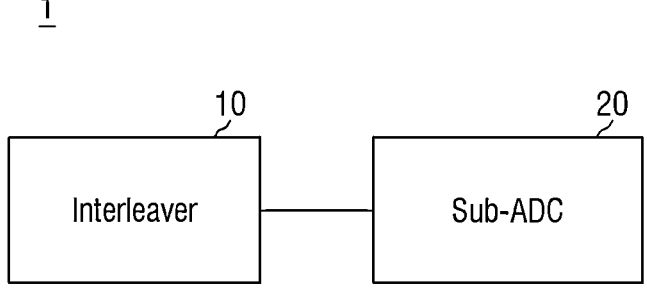
FIG. 1 is a block diagram illustrating an analog-to-digital converter according to some embodiments.

Terms such as "unit" and "module" used in the present disclosure or functional blocks shown in the drawings may be implemented in the form of hardware, software or combination thereof configured to perform a specific function. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), electrical components (such as at least one of transistors, resistors, capacitors, etc.), electronic circuits including said components, etc.

Hereinafter, an analog-to-digital converter according to some embodiments will be described with reference to the accompanying drawings wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Additionally, when the terms "about" or "substantially" are used in this specification in connection with a numerical value and/or geometric terms, it is intended that the associated numerical value includes a manufacturing tolerance (e.g., ±10%) around the stated value and/or term. Further, regardless of whether numerical values and/or geometric terms are modified as "about" or "substantially," it will be understood that these values should be construed as including a manufacturing or operational tolerance (e.g., ±10%) around the stated numerical values and/or geometry.

FIG. 1 is a block diagram illustrating an analog-to-digital converter according to some embodiments.

Referring to FIG. 1, in some embodiments, an analog-to-digital converter (ADC) 1 may include an interleaver 10 and at least one sub-ADC 20. In some embodiments, the analog-to-digital converter 1 may include a time-interleaved analog-to-digital converter 1.

In some embodiments, the sub-ADC 20 may include a plurality of sub-ADCs 20.

In some embodiments, the interleaver 10 is configured to perform intermediate processing for a signal input to the interleaver 10 before the signal input to the interleaver 10 is transferred to sub-ADC 20 and/or the plurality of sub-ADCs 20. For example, the interleaver 10 may include an amplification circuit which may be configured to increase a gain of the signal, a buffering circuit, etc.

In some embodiments, the sub-ADC 20 may operate in accordance with a common mode voltage of an interleaver output signal Vout output from the interleaver 10. In the present disclosure, the common mode voltage capable of operating the sub-ADC 20 at an optimal speed will be referred to as a target voltage VTG.

Figure 2:
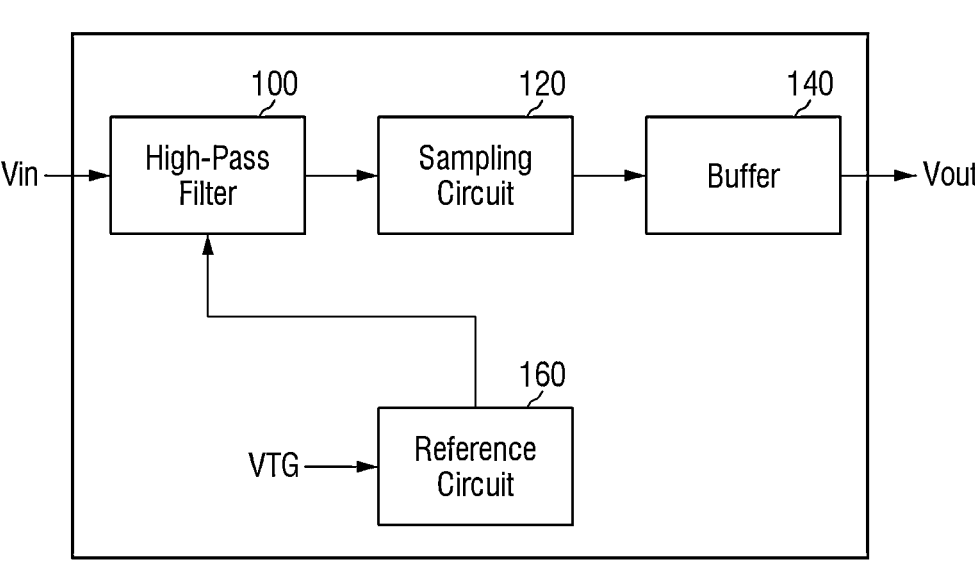
FIG. 2 is a block diagram illustrating an interleaver in the analog-to-digital converter shown in FIG. 1.

FIG. 2 is a block diagram illustrating an interleaver in the analog-to-digital converter shown in FIG. 1.

Referring to FIG. 2, the interleaver 10 may receive an interleaver input signal Vin and transfer an interleaver output signal Vout to the sub-ADC 20.

In some embodiments, the interleaver 10 may include a high-pass filter 100, a sampling circuit 120, a buffer 140 and a reference circuit 160.

In some embodiments, the target voltage VTG input to the reference circuit 160 may be output as the common mode voltage of the interleaver output signal Vout via the high-pass filter 100, the sampling circuit 120 and the buffer 140. A process in which the target voltage VTG is processed in the interleaver 10 will be described later.

In some embodiments, the high-pass filter 100 is configured to remove the common mode voltage of the interleaver input signal Vin. In addition, the high-pass filter 100 may receive a voltage from the reference circuit 160 and use the voltage as the common mode voltage of the interleaver input signal Vin. A detailed configuration of the high-pass filter 100 will be described later with reference to FIG. 3.

In some embodiments, the sampling circuit 120 is configured to sample the signal passing through the high-pass filter 100. The sampling circuit 120 may sample the interleaver input signal Vin, which is an analog signal, at every predetermined (and/or otherwise set) time, maintain a magnitude of the signal measured at a corresponding time, and transfer the signal to the buffer. A detailed configuration of the sampling circuit 120 will be described later with reference to FIG. 3.

In some embodiments, the buffer 140 is configured to buffer the signal passing through the sampling circuit 120. The buffer 140 may buffer the signal and output the buffered signal to the outside of the interleaver 10. A detailed configuration of the buffer 140 will be described later with reference to FIG. 3.

In some embodiments, the reference circuit 160 is configured to receive the target voltage VTG for driving the sub-ADC 20 (20 in FIG. 1) at an optimal speed. The reference circuit 160 may generate an intermediate target voltage VTG' based on the target voltage VTG, and may transfer the generated intermediate target voltage VTG' to the high-pass filter 100. A detailed configuration of the reference circuit 160 will be described later with reference to FIG. 3.

Figure 3:
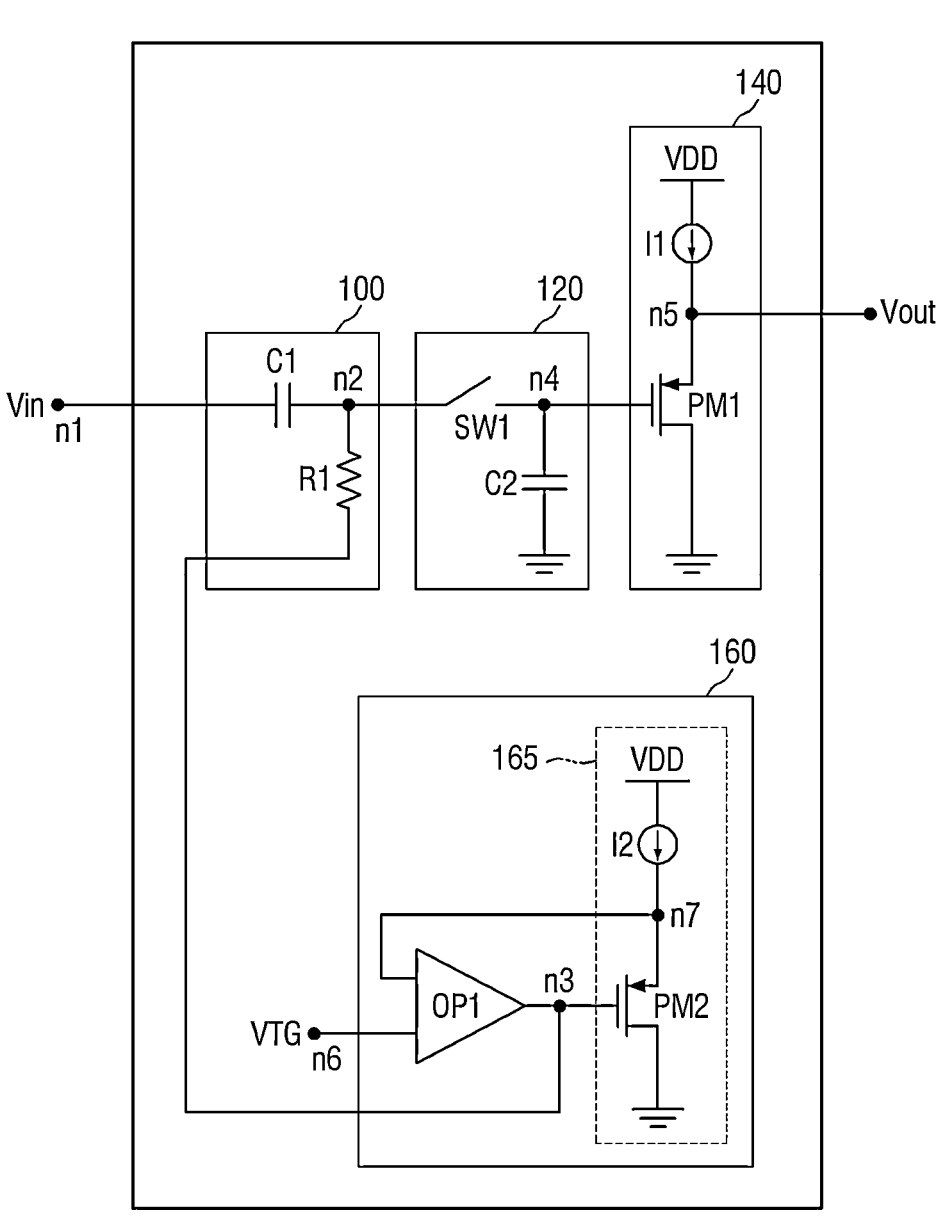
FIG. 3 is a circuit diagram illustrating an interleaver included in an analog-to-digital converter according to some embodiments.

FIG. 3 is a circuit diagram illustrating an interleaver included in an analog-to-digital converter according to some embodiments.

Referring to FIG. 3, in some embodiments, the interleaver 10 may include a high-pass filter 100. The high-pass filter 100 may receive the interleaver input signal Vin from a first node n1. The high-pass filter 100 may include a first capacitor C1 and a first resistor R1. The first capacitor C1 may be positioned between the first node n1 and a second node n2. The first resistor R1 may be positioned between the second node n2 and a third node n3. A signal of the second node n2 may be transferred to the sampling circuit 120.

In some embodiments, the interleaver 10 may include a sampling circuit 120. The sampling circuit 120 may receive a signal from the second node n2. The sampling circuit 120 may include a first switch SW1 and a second capacitor C2. The first switch SW1 may be positioned between the second node n2 and a fourth node n4. The second capacitor C2 may be positioned between the fourth node n4 and a ground. A signal of the fourth node n4 may be transferred to the buffer 140.

In some embodiments, the interleaver 10 may include a buffer 140. The buffer 140 may receive the signal from the fourth node n4. In some embodiments, the buffer 140 may include a source follower circuit. For example, the buffer 140 may be in the form of a source follower that includes a first p-channel metal-oxide-semiconductor (PMOS) PM1 and a first current source I1, but the embodiments of the present disclosure are not limited thereto. Some embodiments of the present disclosure may include other types of buffers. For example, some embodiments of the present disclosure may include a buffer in the form of a Flipped Voltage Follower (FVF).

The source follower circuit included in the buffer 140 may be gated from the signal of the fourth node n4 to output the signal to a fifth node n5. The signal of the fifth node n5 may be output to the outside of the interleaver 10, and the signal of the fifth node n5 and the interleaver output signal Vout may be the same as each other. The first PMOS PM1 may be positioned between the fifth node n5 and the ground. The first current source I1 may be positioned between a buffer driving voltage VDD and the fifth node n5.

In some embodiments, the interleaver 10 may include a reference circuit 160. The reference circuit 160 may receive the target voltage VTG from a sixth node n6. The reference circuit 160 may include a first operational amplifier OP1 and a replica circuit 165. In at least some embodiments, the configuration of the replica circuit 165 may be the same as (and/or substantially similar to) that of the buffer 140. The first operational amplifier OP1 may receive a signal from the sixth node n6 and a seventh node n7 and output the signal to the third node n3. The signal output from the third node n3 may be transferred to the high-pass filter 100. The replica circuit 165 may be gated from the signal of the third node n3 to output the signal to the seventh node n7. The signal output from the seventh node n7 may be transferred to the first operational amplifier OP1.

In some embodiments, the replica circuit 165 may include the same source follower circuit as that of the buffer 140. For example, the replica circuit 165 may be in the form of a source follower that includes a second PMOS PM2 and a second current source I2. The second PMOS PM2 may be positioned between the seventh node n7 and the ground. The second current source I2 may be positioned between the buffer driving voltage VDD and the seventh node n7. A magnitude of the first current source I1 included in the buffer 140 and a magnitude of the second current source I2 included in the replica circuit 165 may be the same as (and/or substantially similar to) each other. In addition, a size of the first PMOS PM1 included in the buffer 140 and a size of the second PMOS PM2 included in the replica circuit 165 may be the same as each other.

FIGS. 4 to 7 are circuit diagrams illustrating an operation of the interleaver shown in FIG. 3. FIG. 8 is a view illustrating an operation of the interleaver shown in FIGS. 4 to 7.

Hereinafter, when the signal of each node is described, a signal measured at an (n)th node is defined as an (n)th signal. In addition, for convenience of description, only the common mode voltage of each node is shown in the drawings.

Figure 4:
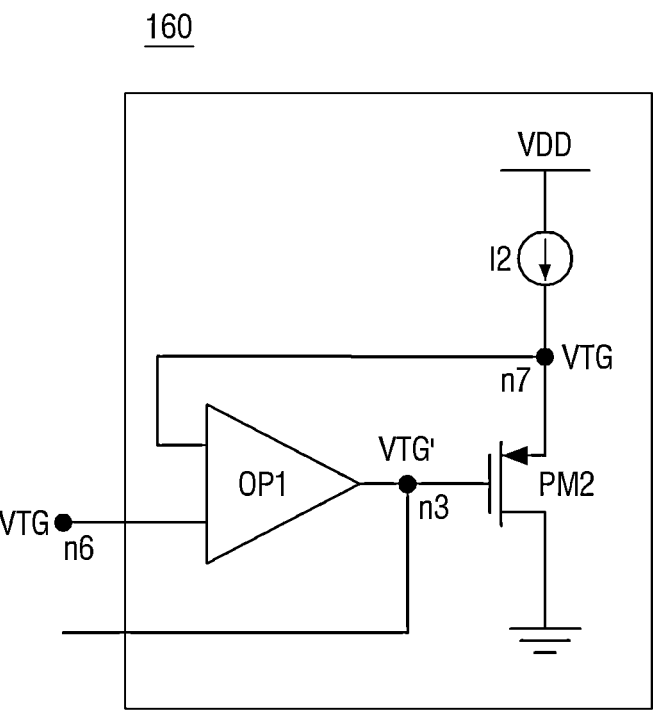
FIGS. 4 to 7 are circuit diagrams illustrating an operation of the interleaver shown in FIG. 3.

Referring to FIGS. 4 and 8, in some embodiments, the target voltage VTG, which is a common mode voltage that allows the sub-ADC 20 to be optimally driven, may be input to the reference circuit 160. A voltage of the seventh node n7 may be the same as the target voltage VTG by characteristics of the first operational amplifier OP1. A voltage of the third node n3 may be lowered as much as a threshold voltage VTH of the second PMOS PM2 as compared with the target voltage VTG. The voltage of the third node n3 is referred to as the intermediate target voltage VTG'. The intermediate target voltage VTG' may be defined as follows.

$$VTG' = VTG - VTH$$

In some embodiments, the intermediate target voltage VTG' may be transferred to the high-pass filter 100 along the third node n3.

Figure 5:
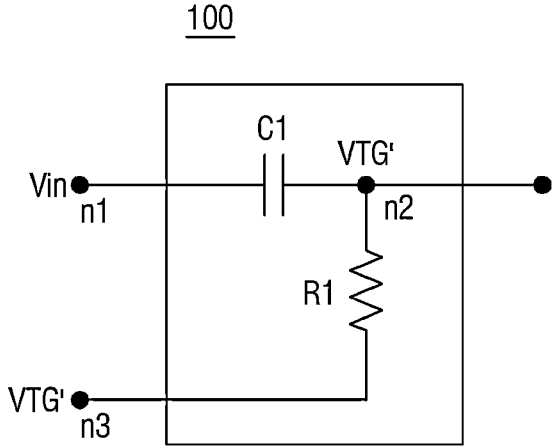

Referring to FIGS. 5 and 8, in some embodiments, the high-pass filter 100 may receive the interleaver input signal Vin at the first node n1. The interleaver input signal Vin may include an alternating current signal vin and a direct current signal VIN. The interleaver input signal Vin may be defined as follows.

$$Vin = vin + VIN$$

Therefore, a first signal S1 of FIG. 8 is the same as the interleaver input signal Vin.

In addition, the high-pass filter 100 may receive the intermediate target voltage VTG' from the third node n3.

In some embodiments, the direct current signal VIN included in the interleaver input signal Vin may be removed by the first capacitor C1. Therefore, only the alternating current signal vin of the interleaver input signal Vin may be transferred to the second node n2.

In some embodiments, the intermediate target voltage VTG' input to the third node n3 may be transferred to the second node n2 as it is. Therefore, a second signal S2 measured at the second node n2 may be a signal that uses the intermediate target voltage VTG' as the common mode voltage and includes the alternating current signal vin of the interleaver input signal Vin.

Figure 6:
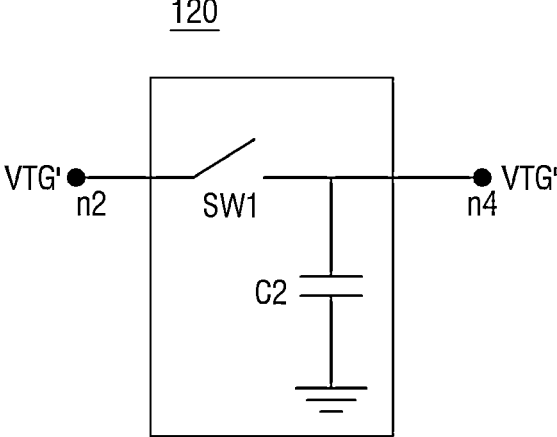

Referring to FIGS. 6 and 8, in some embodiments, the sampling circuit 120 may receive the second signal S2 from the second node n2.

In some embodiments, the sampling circuit 120 may include a first switch SW1 and a second capacitor C2. The first switch SW1 may sample the second signal S2 and transfer the sampled second signal S2 to the fourth node n4. The common mode voltage of the second signal S2 may not be changed even though it passes through the sampling circuit 120. That is, a fourth signal S4 measured at the fourth node n4 may correspond to a signal obtained by sampling the second signal S2 by using the intermediate target voltage VTG' as the common mode voltage.

For example, the sampling circuit 120 may sample a magnitude of the second signal S2 measured at a first time t1 by using the first switch SW1 and transfer the sampled signal to the buffer. The sampling circuit 120 may operate equally at a second time t2 to a fourth time t4.

Figure 7:
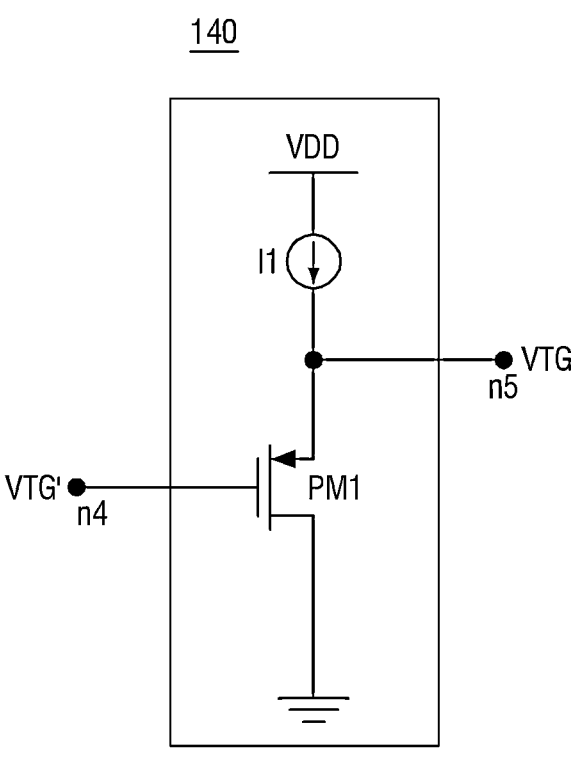
Figure 8:
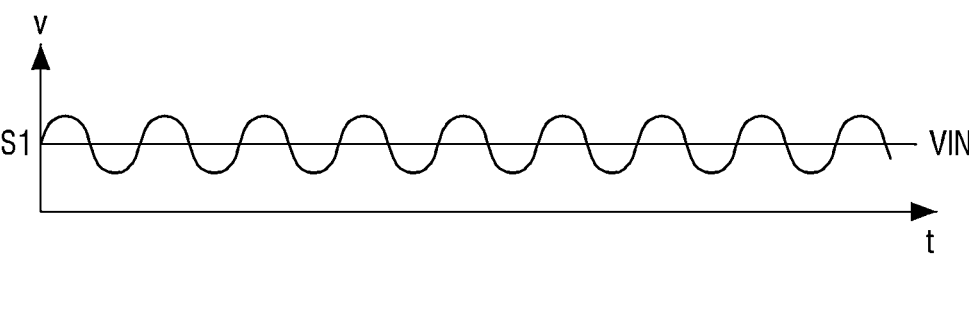
FIG. 8 is a view illustrating an operation of the interleaver shown in FIGS. 4 to 7.
Figure 8:
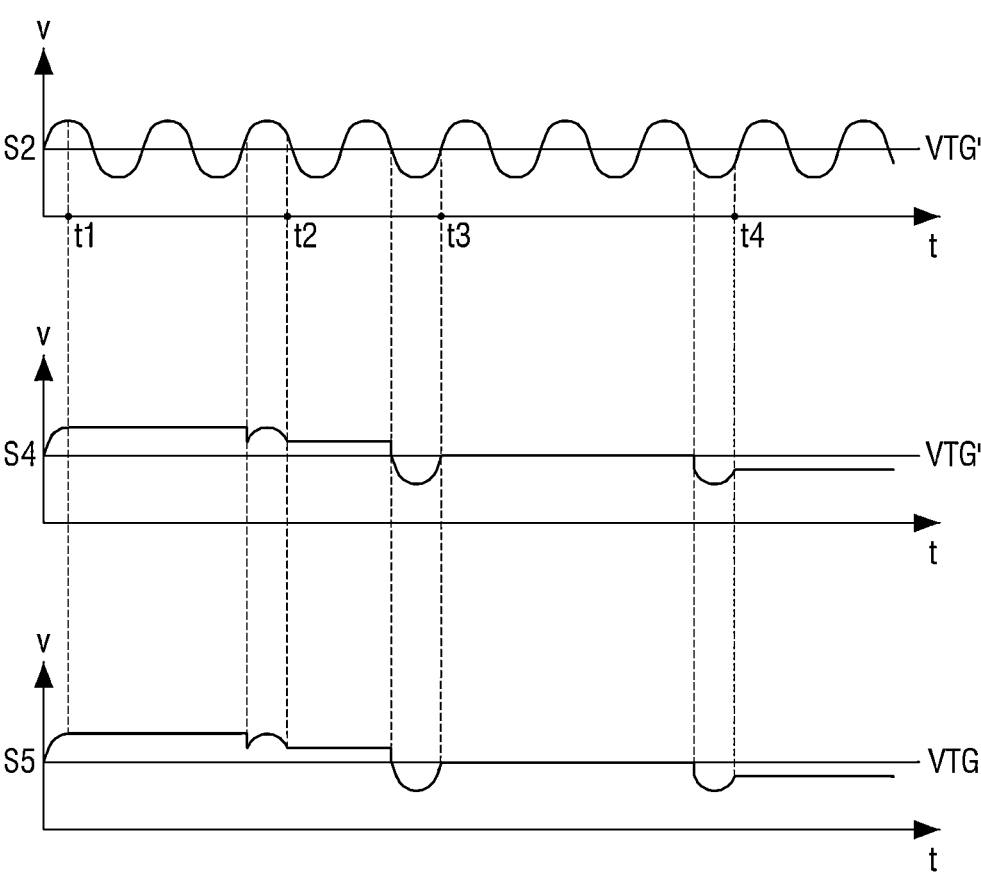

Referring to FIGS. 7 and 8, in some embodiments, the buffer 140 may receive the fourth signal S4 from the fourth node n4.

In some embodiments, the buffer 140 may include a first current source I1 and a first PMOS PM1. A common mode voltage of the fourth signal S4 may be the intermediate target voltage VTG'. A common mode voltage of a fifth signal S5, which is the signal of the fifth node n5, may be increased as much as the threshold voltage VTH of the first PMOS PM1 as compared with the intermediate target voltage VTG'.

In some embodiments, the size of the first PMOS PM1 may be the same as that of the second PMOS (PM2 of FIG. 4). In addition, a magnitude of the threshold voltage VTH of the first PMOS PM1 may be the same as that of the second PMOS (PM2 of FIG. 4).

Therefore, the common mode voltage of the fifth signal S5 may be the same as the target voltage VTG.

Referring to FIGS. 3 to 8, the reference circuit 160 includes the replica circuit 165 which is same as the buffer 140, whereby a fixed common mode voltage may be set regardless of a change in temperature or process. In some embodiments, voltages of the third node n3 and the fourth node n4 may be the same as each other. Likewise, voltages of the fifth node n5 and the seventh node n7 may be the same as each other.

In addition, according to some embodiments of the present disclosure, the interleaver 10 may set the common mode voltage of the sub-ADC 20 by a feed-forward scheme. Therefore, a fixed common mode voltage may be set even in a circuit that requires a high-speed operation.

Figure 9:
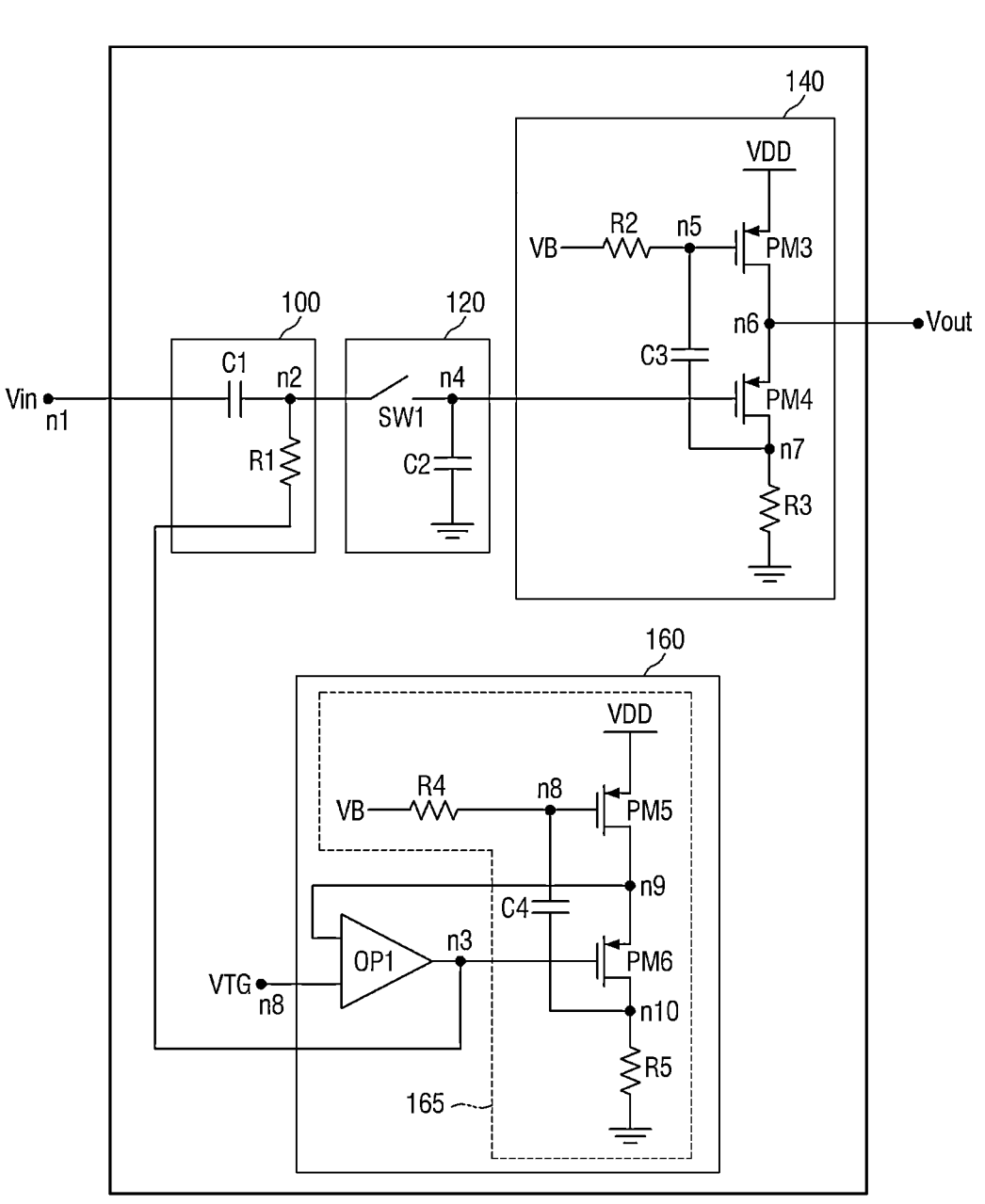
FIG. 9 is a circuit diagram illustrating an interleaver included in an analog-to-digital converter according to some embodiments.

FIG. 9 is a circuit diagram illustrating an interleaver included in an analog-to-digital converter according to some embodiments. For convenience of description, redundant portions of those described as above will be omitted or only briefly described.

Referring to FIG. 9, in some embodiments, the interleaver 10 may include a high-pass filter 100, a sampling circuit 120, a buffer 140 and a reference circuit 160.

In some embodiments, the high-pass filter 100 may receive the interleaver input signal Vin from the first node n1. The operation of the high-pass filter 100 of FIG. 9 is similar to that of the high-pass filter 100 described in FIG. 5. The signal of the second node n2 may be transferred to the sampling circuit 120.

In some embodiments, the sampling circuit 120 is configured to receive the signal from the second node n2. The operation of the sampling circuit 120 of FIG. 9 is similar to that of the sampling circuit 120 described in FIG. 6. The signal of the fourth node n4 may be transferred to the buffer 140.

In some embodiments, the buffer 140 is configured to receive the signal from the fourth node n4. In some embodiments, the buffer 140 may include a flipped voltage follower circuit. For example, the buffer 140 may include a third PMOS PM3, a fourth PMOS PM4, a second resistor R2, a third resistor R3 and a third capacitor C3, but the embodiments of the present disclosure are not limited thereto. Some embodiments of the present disclosure may include other types of buffers. For example, some embodiments of the present disclosure may include a buffer in the form of a source follower.

The flipped voltage follower circuit included in the buffer 140 may be gated from the signal of the fourth node n4 to output the signal to the sixth node n6. The signal of the sixth node n6 may be output to the outside of the interleaver 10. A sixth signal (not shown), which is the signal of the sixth node n6, and the interleaver output signal Vout may be the same as each other. The third PMOS PM3 may be positioned between the buffer driving voltage VDD and the sixth node n6. The fourth PMOS PM4 may be positioned between the sixth node n6 and the seventh node n7. The second resistor R2 may be positioned between a bias voltage VB and the fifth node n5. The third resistor R3 may be positioned between the seventh node n7 and the ground. The third capacitor C3 may be positioned between the fifth node n5 and the seventh node n7.

In some embodiments, the reference circuit 160 may receive the target voltage VTG from an eighth node n8. The reference circuit 160 may include a first operational amplifier OP1 and a replica circuit 165. The configuration of the replica circuit 165 and the configuration of the buffer 140 may be the same as each other. The first operational amplifier OP1 may receive a signal from the eighth node n8 and a ninth node n9 and output the signal to the third node n3. The signal output from the third node n3 may be transferred to the high-pass filter 100. The replica circuit 165 may be gated from the signal of the third node n3 to output the signal to the ninth node n9. The signal output from the ninth node n9 may be transferred to the first operational amplifier OP1.

In some embodiments, the replica circuit 165 may include the same (and/or a substantially similar) flipped voltage follower circuit as that of the buffer 140. For example, sizes of the fifth PMOS PM5, the sixth PMOS PM6, the fourth resistor R4, the fifth resistor R5 and the fourth capacitor C4, which are included in the replica circuit 165, may be the same as those of the third PMOS PM3, the fourth PMOS PM4, the second resistor R2, the third resistor R3 and the third capacitor C3, which are included in the buffer 140.

Referring to FIG. 9, the reference circuit 160 includes the replica circuit 165 which is the same as (and/or substantially similar to) the buffer 140, whereby a fixed common mode voltage may be set regardless of a change in temperature or process. In some embodiments, voltages of the third node n3 and the fourth node n4 may be the same as (and/or substantially similar to) each other. Likewise, voltages of the sixth node n6 and the ninth node n9 may be the same as (and/or substantially similar to) each other.

In addition, according to some embodiments of the present disclosure, the interleaver 10 may set the common mode voltage of the sub-ADC 20 by a feed-forward scheme. Therefore, the fixed common mode voltage may be set even in a circuit that requires a high-speed operation.

Figure 10:
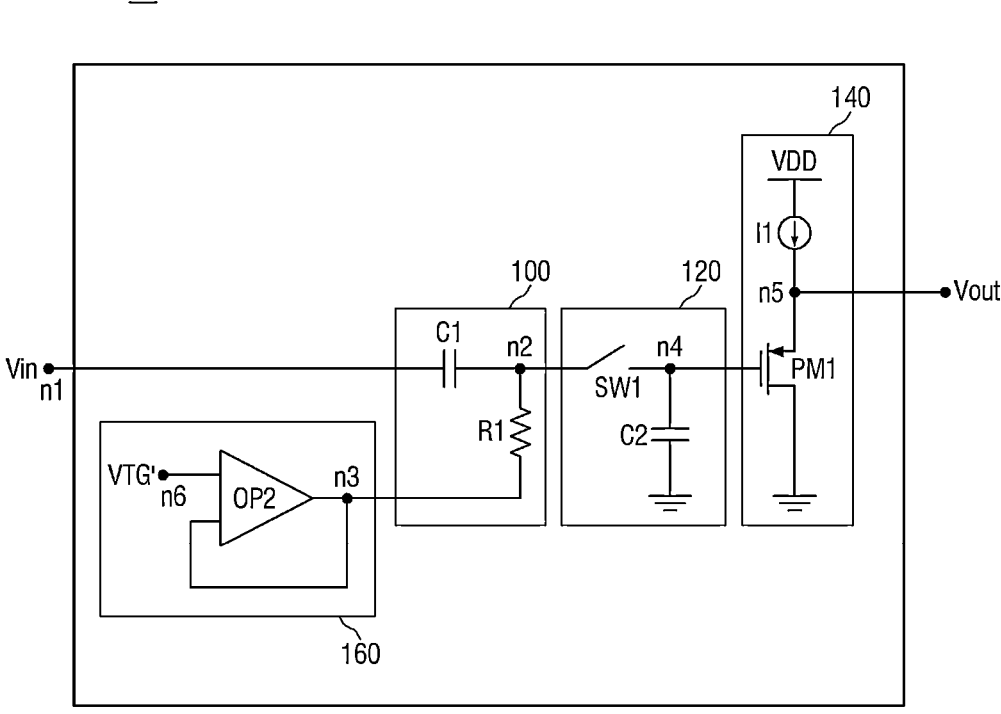
FIG. 10 is a circuit diagram illustrating an interleaver included in an analog-to-digital converter according to some embodiments.

FIG. 10 is a circuit diagram illustrating an interleaver included in an analog-to-digital converter according to some embodiments. For convenience of description, redundant portions of those described as above will be omitted or briefly described.

Referring to FIG. 10, in some embodiments, the interleaver 10 may include a high-pass filter 100, a sampling circuit 120, a buffer 140 and a reference circuit 160.

The high-pass filter 100 may receive the interleaver input signal Vin from the first node n1. The high-pass filter 100 may include a first capacitor C1 and a first resistor R1. The first capacitor C1 may be positioned between the first node n1 and the second node n2. The first resistor R1 may be positioned between the second node n2 and the third node n3. The signal of the second node n2 may be transferred to the sampling circuit 120.

The sampling circuit 120 may receive the signal from the second node n2. The sampling circuit 120 may include a first switch SW1 and a second capacitor C2. The first switch SW1 may be positioned between the second node n2 and the fourth node n4. The second capacitor C2 may be positioned between the fourth node n4 and the ground. The signal of the fourth node n4 may be transferred to the buffer 140.

The buffer 140 may receive the signal from the fourth node n4. In some embodiments, the buffer 140 may include a source follower circuit. For example, the buffer 140 may be in the form of a source follower that includes a first PMOS PM1 and a first current source I1, but the embodiments of the present disclosure are not limited thereto. Some embodiments of the present disclosure may include other types of buffers. For example, some embodiments of the present disclosure may include a buffer in the form of a Flipped Voltage Follower (FVF).

The source follower circuit included in the buffer 140 may be gated from the signal of the fourth node n4 to output the signal to the fifth node n5. The signal of the fifth node n5 may be output to the outside of the interleaver 10. A fifth signal (not shown), which is the signal of the fifth node n5, and the interleaver output signal Vout may be the same as (and/or substantially similar to) each other. The first PMOS PM1 may be positioned between the fifth node n5 and the ground. The first current source I1 may be positioned between the buffer driving voltage VDD and the fifth node n5.

The reference circuit 160 may receive the target voltage VTG from the sixth node n6. The reference circuit 160 may include a second operational amplifier OP2. The second operational amplifier OP2 may receive the signal from the sixth node n6 and output the signal to the third node n3. The signal output from the third node n3 may be transferred to the high-pass filter 100.

In some embodiments, the reference circuit 160 may serve as a buffer that outputs the input target voltage VTG as it is.

Therefore, a desired target voltage may be directly input, so that an influence caused by a change in temperature and/or process may be minimized.

Figure 11:
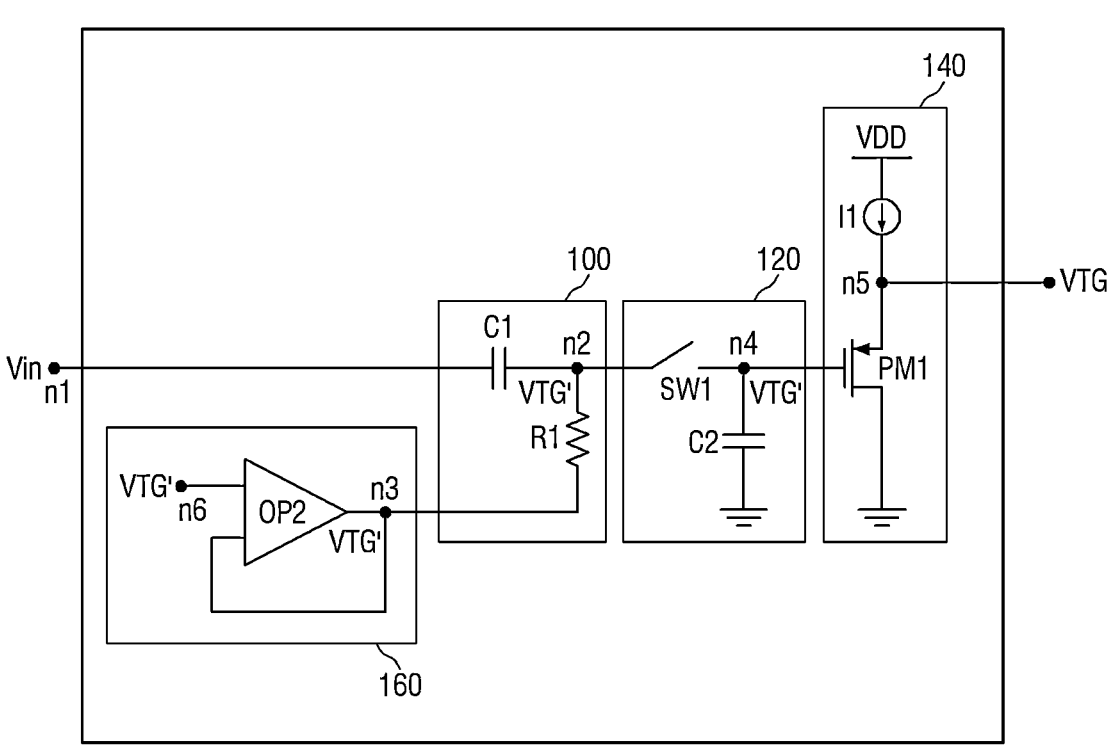
FIG. 11 is a circuit diagram illustrating an operation of the interleaver shown in FIG. 10.

FIG. 11 is a circuit diagram illustrating an operation of the interleaver shown in FIG. 10.

Hereinafter, when the signal of each node is described, a signal measured at an (n)th node is defined as an (n)th signal. In addition, for convenience of description, only the common mode voltage of each node is shown in the drawings.

Referring to FIGS. 8 and 11, in some embodiments, the sub-ADC 20 may be driven at an optimal speed when the common mode voltage of the signal input to the sub-ADC 20 is the target voltage VTG.

In some embodiments, an input voltage of the reference circuit 160 that allows the common mode voltage of the fifth signal S5, which is the signal of the fifth node n5, to become the target voltage VTG may be obtained as follows. The common mode voltage of the fifth signal S5, which is the signal of the fifth node n5, may be increased as much as the threshold voltage VTH of the first PMOS PM1 as compared with the common mode voltage of the fourth signal S4. For example, the common mode voltage of the fourth signal S4 may be the intermediate target voltage VTG' lowered as much as the threshold voltage of the first PMOS PM1 from the target voltage VTG. The intermediate target voltage VTG' may be defined as follows.

$$VTG' = VTG - VTH$$

Likewise, the common mode voltage of the second signal S2 and the voltage of the third node n3 may be the intermediate target voltages VTG'. The voltage of the sixth node n6 may be the same as that of the third node n3 by characteristics of the second operational amplifier OP2.

Therefore, the common mode voltage of the interleaver output signal Vout may be set as the target voltage VTG by inputting the intermediate target voltage VTG' to the reference circuit 160.

When the intermediate target voltage VTG' is input to the reference circuit 160, the operation of the circuit in the interleaver 10 is as follows.

The intermediate target voltage VTG' input to the sixth node n6 may be transferred to the high-pass filter 100 along the third node n3.

In some embodiments, the high-pass filter 100 may receive the interleaver input signal Vin from the first node n1. The interleaver input signal Vin may include an alternating current signal vin and a direct current signal VIN. The interleaver input signal Vin may be defined as follows.

$$Vin = vin + VIN$$

Therefore, the first signal S1 of FIG. 8 is the same as the interleaver input signal Vin.

Also, the high-pass filter 100 may receive the intermediate target voltage VTG' from the third node n3.

In some embodiments, the direct current signal VIN included in the interleaver input signal Vin may be removed by the first capacitor C1. Therefore, only the alternating current signal vin of the interleaver input signal Vin may be transferred to the second node n2.

In some embodiments, the intermediate target voltage VTG' input to the third node n3 may be transferred to the second node n2 as it is. Therefore, the second signal S2 measured at the second node n2 may be the signal that uses the intermediate target voltage VTG' as the common mode voltage and includes the alternating current signal vin of the interleaver input signal Vin.

In some embodiments, the sampling circuit 120 may receive the second signal S2 from the second node n2. The sampling circuit 120 may include a first switch SW1 and a second capacitor C2. The first switch SW1 may sample the second signal S2 and transfer the sampled second signal S2 to the fourth node n4. The common mode voltage of the second signal S2 may not be changed even though it passes through the sampling circuit 120. That is, the fourth signal S4 measured at the fourth node n4 may correspond to a signal obtained by sampling the second signal S2 by using the intermediate target voltage VTG' as the common mode voltage.

For example, the sampling circuit 120 may sample the magnitude of the second signal S2 measured at the first time t1 by using the first switch SW1 and transfer the sampled signal to the buffer. The sampling circuit 120 may operate equally even at the second time t2 to the fourth time t4.

In some embodiments, the buffer 140 may receive the fourth signal S4 from the fourth node n4.

In some embodiments, the buffer 140 may include a first current source I1 and a first PMOS PM1. The common mode voltage of the fourth signal S4 may be the intermediate target voltage VTG'. The common mode voltage of the fifth signal S5, which is the signal of the fifth node n5, may be increased as much as the threshold voltage VTH of the first PMOS PM1 as compared with the intermediate target voltage VTG'. That is, the common mode voltage of the fifth signal S5 may be the same as the target voltage VTG.

According to some embodiments of the present disclosure, the interleaver 10 may set the common mode voltage of the sub-ADC 20 by a feed-forward scheme. Therefore, a fixed common mode voltage may be set even in a circuit that requires a high-speed operation.

Although the embodiments of the present disclosure have been described with reference to the accompanying drawings, it will be apparent to those skilled in the art that the present disclosure can be fabricated in various forms without being limited to the above-described embodiments and can be embodied in other specific forms without departing from the technical spirits and essential characteristics. Thus, the above embodiments are to be considered in all respects as illustrative and not restrictive.

What is claimed is:

1. An analog-to-digital converter (ADC) comprising:
an interleaver configured to receive and process an analog input signal; and
at least one sub-ADC,
wherein the interleaver includes
a reference circuit configured to use a replica circuit to output a second voltage based on a first voltage,
a high-pass filter configured to receive the second voltage and to output a first signal obtained by changing a common mode voltage of the analog input signal to the second voltage,
a sampling circuit configured to generate a second signal obtained by sampling an alternate current component of the first signal, and
a buffer configured to output a third signal obtained by buffering the second signal by using a buffering circuit, wherein the at least one sub-ADC is configured to convert the third signal into a digital output signal using the first voltage, and wherein the replica circuit replicates the buffering circuit.

2. The analog-to-digital converter of claim 1, wherein the reference circuit includes the replica circuit, and the buffer includes the buffering circuit.

3. The analog-to-digital converter of claim 2, wherein the buffering circuit includes a second transistor and a third transistor, which are connected in series between a driving voltage of the buffering circuit and a ground, the second transistor is positioned between the driving voltage of the buffering circuit and an output terminal of the buffering circuit, and the third transistor is configured to be gated by the second signal.

4. The analog-to-digital converter of claim 3, wherein the reference circuit further includes a first operational amplifier, and an input terminal of the replica circuit is connected to an output terminal of the first operational amplifier, and an output terminal of the replica circuit is connected to a first input terminal of the first operational amplifier.

5. The analog-to-digital converter of claim 4, wherein the reference circuit is configured such that the first voltage is provided to a second input terminal of the first operational amplifier different from the first input terminal of the first operational amplifier.

6. The analog-to-digital converter of claim 1, wherein the buffering circuit includes a first transistor and a current source, and the first transistor is configured to be gated by the second signal and positioned between a ground and an output terminal of the buffer.

7. The analog-to-digital converter of claim 6, wherein the reference circuit further includes a first operational amplifier, an input terminal of the replica circuit is connected to an output terminal of the first operational amplifier, and an output terminal of the replica circuit is connected to a first input terminal of the first operational amplifier.

8. The analog-to-digital converter of claim 7, wherein the reference circuit is configured such that the first voltage is provided to a second input terminal of the first operational amplifier different from the first input terminal of the first operational amplifier.

9. The analog-to-digital converter of claim 1, wherein the reference circuit is configured to output the second voltage, which is lower than the first voltage by as much as a predetermined voltage.

10. The analog-to-digital converter of claim 9, wherein the reference circuit includes a transistor, and the predetermined voltage is such that the second voltage is lower than the first voltage as much as a threshold voltage of the transistor.

11. The analog-to-digital converter of claim 1, wherein a common mode voltage of the third signal is the same as the first voltage.

12. The analog-to-digital converter of claim 1, wherein the reference circuit includes a first operational amplifier including a first input terminal and a second input terminal, and the first operational amplifier is configured to receive the first voltage at the first input terminal and the second input terminal is connected to an output terminal.

13. An analog-to-digital converter (ADC) comprising:
a reference circuit configured to receive a first voltage from outside of the ADC and to output a second voltage based on the first voltage;
a high-pass filter configured to receive the second voltage and to output a first signal obtained by changing a common mode voltage of an analog input signal to the second voltage;
a sampling circuit configured to generate a second signal obtained by sampling an alternating current component of the first signal;
a buffer configured to output a third signal obtained by buffering the second signal by using a buffering circuit; and
a plurality of sub-ADCs configured to convert the third signal into a digital output signal,
wherein the reference circuit is configured to output the second voltage using a replica circuit that replicates the buffering circuit of the buffer.

14. The analog-to-digital converter of claim 13, wherein the reference circuit includes a first operational amplifier in which a first input terminal is connected to the replica circuit and the first voltage is provided to a second input terminal.

15. The analog-to-digital converter of claim 14, wherein the first input terminal is connected to an output terminal of the replica circuit, and an output terminal of the first operational amplifier is connected to an input terminal of the replica circuit.

16. The analog-to-digital converter of claim 15, wherein the replica circuit includes a first transistor and a current source, and the first transistor configured to be gated by the second signal and positioned between a ground and the output terminal of the replica circuit.

17. The analog-to-digital converter of claim 15, wherein the replica circuit includes a second transistor and a third transistor, the second transistor positioned between a driving voltage of the replica circuit and the output terminal of the replica circuit, and the third transistor configured to be gated by the second signal.

18. The analog-to-digital converter of claim 13, wherein a common mode voltage of the third signal is the same as the first voltage.

19. The analog-to-digital converter of claim 13, wherein the high-pass filter includes a first capacitor and a first resistor, the first capacitor configured to receive an input signal at one end, another end of the first capacitor is connected to one end of the first resistor, and another end of the first resistor is connected to an output terminal of the reference circuit to receive the second voltage from the reference circuit.

20. An analog-to-digital converter (ADC) comprising:
a reference circuit including a replica circuit, which includes a first transistor and a current source, and a first operational amplifier in which a first input terminal of the first operational amplifier is connected to the replica circuit and configured to provide a first voltage to a second input terminal of the first operational amplifier;
a high-pass filter including a first capacitor and a first resistor, the high-pass filter configured such that one end of the first capacitor is configured to receive an input signal and one end of the first resistor is connected to an output terminal of the reference circuit;

a sampling circuit including a first switch and a second capacitor, one end of the first switch connected to an output terminal of the high-pass filter and another end of the first switch being connected to the second capacitor; 5 a buffer configured to receive an output of the sampling circuit and including the same circuit as the replica circuit; and a plurality of sub-ADCs configured to convert an output signal of the buffer into a digital signal. 10

\* \* \* \* \*